(12) United States Patent
Shabani et al.

(10) Patent No.: US 12,393,856 B2
(45) Date of Patent: Aug. 19, 2025

(54) SUPERCONDUCTING QUANTUM ARCHITECTURES

(71) Applicant: Cisco Technology, Inc., San Jose, CA (US)

(72) Inventors: Alireza Shabani, Los Angeles, CA (US); Ramana Rao V. R. Kompella, Cupertino, CA (US)

(73) Assignee: CISCO TECHNOLOGY, INC., San Jose, CA (US)

( * ) Notice: Subject to any disclaimer, the term of this patent is extended or adjusted under 35 U.S.C. 154(b) by 555 days.

(21) Appl. No.: 17/853,230

(22) Filed: Jun. 29, 2022

(65) Prior Publication Data

US 2024/0005187 A1    Jan. 4, 2024

(51) Int. Cl.
  *H04B 10/12*  (2006.01)
  *B81B 3/00*  (2006.01)
  (Continued)

(52) U.S. Cl.
  CPC ........... *G06N 10/20* (2022.01); *B81B 3/0029* (2013.01); *G06N 10/40* (2022.01); *H04B 10/25* (2013.01); *H04B 10/70* (2013.01)

(58) Field of Classification Search
  CPC .... H04B 10/70; H04B 10/40; H04B 10/2575; H04B 10/25753; H04B 10/25;
  (Continued)

(56) References Cited

U.S. PATENT DOCUMENTS

| | | | |
|---|---|---|---|
| 7,889,992 B1 * | 2/2011 | DiVincenzo | B82Y 10/00 398/115 |
| 9,350,460 B2 * | 5/2016 | Paik | B82Y 10/00 |
| (Continued) | | | |

OTHER PUBLICATIONS

Arute et al, "Quantum supremacy using a programmable superconducting processor," https://doi.org/10.1038/ $41586-019-1666-5, published Oct. 2019, 6 pages (505-511).

(Continued)

*Primary Examiner* — Hanh Phan
(74) *Attorney, Agent, or Firm* — Edell, Shapiro & Finnan, LLC

(57) ABSTRACT

Presented herein are techniques through which modular architectures and systems may be implemented for superconducting (SC) quantum processing elements or chips utilizing photonic interconnects. In one instance, an SC processing element is provided that includes a plurality of interconnected qubits, wherein a first qubit of the plurality of interconnected qubits is interconnected with a first microwave-optical transducer. In one instance, a system is provided that includes a first SC processing element comprising a first plurality of interconnected qubits, wherein a first microwave-optical transducer is interconnected with a first qubit of the first plurality of interconnected qubits; a second SC processing element comprising a second plurality of interconnected qubits, wherein a second microwave-optical transducer is interconnected with a first qubit of the second plurality of interconnected qubits; and an optical network interconnecting the first microwave-optical transducer and the second microwave-optical transducer.

22 Claims, 11 Drawing Sheets

(51) Int. Cl.
  *G06N 10/20* (2022.01)
  *G06N 10/40* (2022.01)
  *H04B 10/25* (2013.01)
  *H04B 10/70* (2013.01)

(58) Field of Classification Search
  CPC ........ G06N 10/20; G06N 10/40; G06N 10/00; H04L 9/0858; H04L 9/0855; H04L 9/0852; H04L 9/0869
  USPC ....... 398/140, 141, 158, 159, 33, 38, 25, 26, 398/27, 135, 136, 137, 138, 139, 155, 398/116; 380/255, 256, 278, 277, 44
  See application file for complete search history.

(56) References Cited

U.S. PATENT DOCUMENTS

| | | | | |
|---|---|---|---|---|
| 11,005,574 | B2* | 5/2021 | Bronn | G06N 10/40 |
| 2019/0147359 | A1 | 5/2019 | Chen et al. | |
| 2020/0012961 | A1 | 1/2020 | Kelly et al. | |
| 2020/0250570 | A1 | 8/2020 | Barzegar et al. | |
| 2020/0401924 | A1* | 12/2020 | Paik | H10N 60/00 |
| 2020/0412457 | A1 | 12/2020 | Bronn et al. | |
| 2021/0302767 | A1 | 9/2021 | Faraon et al. | |
| 2021/0342729 | A1 | 11/2021 | Scheer et al. | |

OTHER PUBLICATIONS

Xia et al, "Solid state optical interconnect between distant superconducting quantum chips," https://journals.aps.org/pra/abstract/10.1103/PhysRevA.91.042307#fulltext, published Apr. 2015, 5 pages.
Lauk et al, "Perspectives on quantum transduction," https://iopscience.iop.org/article/10.1088/2058-9565/ab788a, published Mar. 2020, 16 pages.
Awschalom et al, "Development of Quantum Interconnects (QuICs) for Next-Generation Information Technologies," https://journals.aps.org/prxquantum/abstract/10.1103/PRXQuantum.2.017002, Feb. 2021, 21 pages.
Kafri et al, "Tunable inductive coupling of superconducting qubits in the strongly nonlinear regime," https://journals.aps.org/pra/abstract/10.1103/PhysRevA.95.052333#fulltext, May 2017, 4 pages.
Berke et al, "Transmon platform for quantum computing challenged by chaotic fluctuations, " https://www.nature.com/articles/s41467-022-29940-y, published May 2022, 15 pages.
Monroe et al, "Large Scale Modular Quantum Computer Architecture with Atomic Memory and Photonic Interconnects," https://doi.org/10.48550/arXiv.1208.0391, Jul. 2013, 16 pages.
Higginbotham et al, "Harnessing electro-optic correlations in an efficient mechanical converter," https://www.nature.com/articles/s41567-018-0210-0, Jul. 2018, 20 pages.
Zhou et al, "Broadband frequency translation through time refraction in an epsilon-near-zero material," https://doi.org/10.1038/s41467-020-15682-2, May 2020, 7 pages.
Magnard et al, "Microwave Quantum Link between Superconducting Circuits Housed in Spatially Separated Cryogenic Systems," https://pubmed.ncbi.nlm.nih.gov/33449744/, Dec. 2020, 13 pages.
Chou et al, "Deterministic teleportation of a quantum gate between two logical qubits," https://doi.org/10.1038/s41586-018-0470-y, Sep. 2018, 33 pages.
Krinner et al, "Engineering cryogenic setups for 100-qubit scale superconducting circuit systems," https://doi.org/10.1140/epjqt/s40507-019-0072-0, May 2019, 29 pages.
Liu et al, "Extensible 3D architecture for superconducting quantum computing," https://doi.org/10.1063/1.4985435, Jun. 2017, 5 pages.
Monroe et al, "Scaling the Ion Trap Quantum Processor," https://www.science.org/doi/10.1126/science.1231298, Mar. 2013, 7 pages.
Youssefi et al, "Cryogenic electro-optic interconnect for superconducting devices," https://www.nature.com/articles/s41928-021-00570-4, May 2021, 10 pages.
Jiang et al, "Efficient bidirectional piezo-optomechanical transduction between microwave and optical frequency," https://doi.org/10.1038/s41467-020-14863-3, Mar. 2020, 7 pages.
Andrews et al, "Bidirectional and efficient conversion between microwave and optical light," https://www.nature.com/articles/nphys2911, Mar. 2014, 17 pages.
Wikipedia, "Qubit," https://en.wikipedia.org/wiki/Qubit, retrieved May 21, 2022, 9 pages.
Mirhosseini, et al, "Quantum transduction of optical photons from a superconducting qubit," https://www.nature.com/articles/s41586-020-3038-6, Dec. 2020, 17 pages.
Higginbotham et al, "Harnessing electro-optic correlations in an efficient mechanical converter," https://doi.org/10.1038/s41567-018-0210-0, Jul. 2018, 6 pages (1038-1043).

* cited by examiner

SUPERCONDUCTING QUANTUM ARCHITECTURES

TECHNICAL FIELD

The present disclosure relates to architectures for superconducting quantum computers.

BACKGROUND

Quantum computers (QC) use quantum physics for performing computations and can provide advantages for certain tasks such as simulation or optimization of physical systems. Different technologies are under development to build quantum processor units (QPUs). For superconducting (SC) quantum hardware architectures, qubits are formed by nonlinear electric circuits operating in microwave frequencies and the qubits can be coupled via electric circuits, such as through a capacitor, depending on the type of the qubit. Current SC quantum hardware implementations are often limited to less than 100 qubits, however, there is a need for SC quantum architectures that can support implementations involving a much larger number of qubits, such as on the order of thousands or millions of qubits.

DESCRIPTION OF EXAMPLE EMBODIMENTS

Overview

Figure 1:
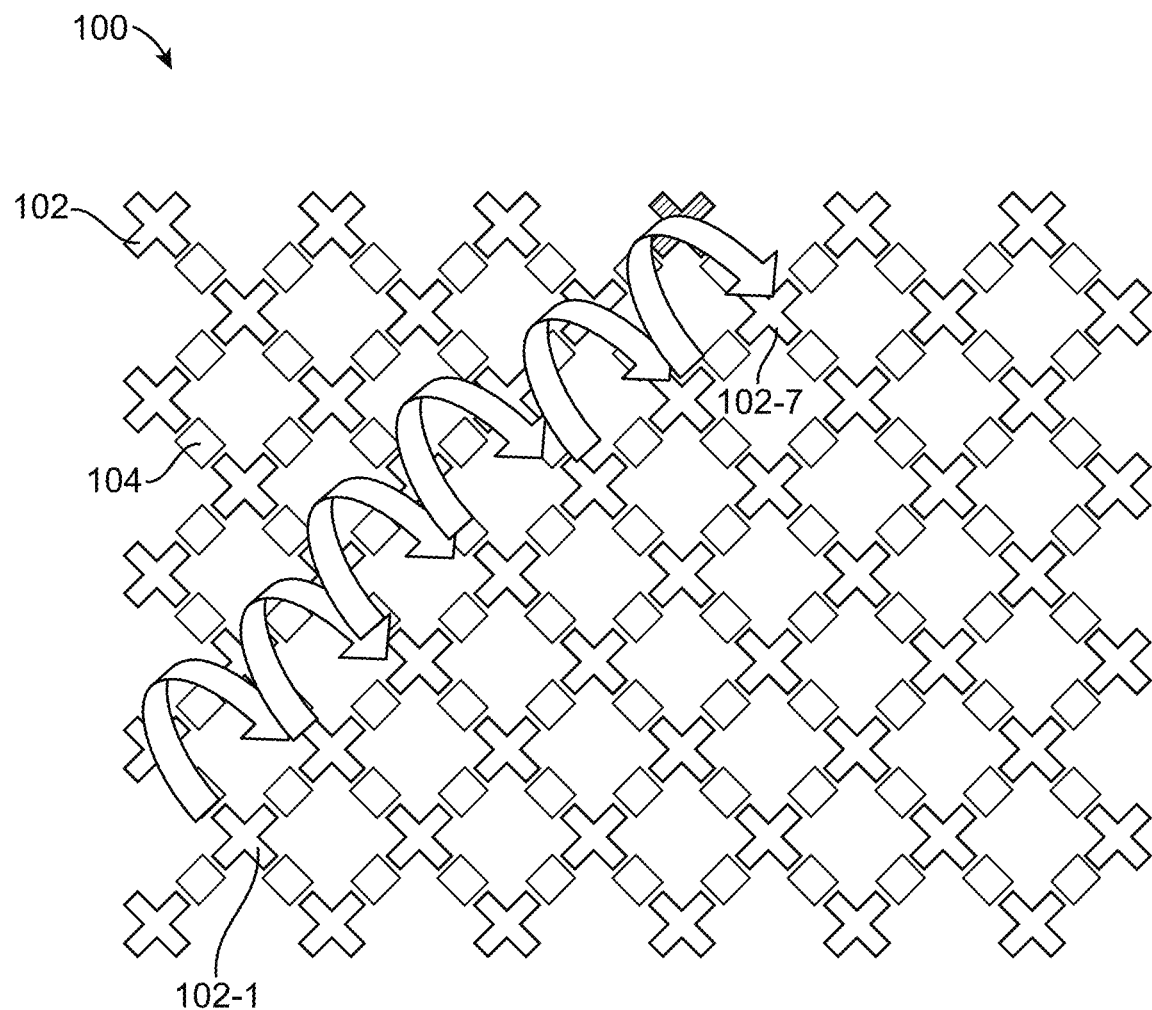
FIG. 1 is a simplified diagram illustrating an example two-dimensional (2D) layout of a conventional superconducting (SC) quantum processing element or chip.

Presented herein are techniques through which modular architectures and systems may be implemented for superconducting (SC) quantum processing elements or chips utilizing photonic interconnects. Architectures and systems described herein may help to solve limitations of existing quantum chip approaches that typically involve qubit-qubit connectivity and single-chip scalability.

In one embodiment, a superconducting (SC) processing element is provided that includes a plurality of interconnected qubits, wherein a first qubit of the plurality of interconnected qubits is interconnected with a first microwave-optical transducer. In one embodiment, a system is provided that includes a first superconducting (SC) processing element comprising a first plurality of interconnected qubits, wherein a first microwave-optical transducer is interconnected with a first qubit of the first plurality of interconnected qubits; a second SC processing element comprising a second plurality of interconnected qubits, wherein a second microwave-optical transducer is interconnected with a first qubit of the second plurality of interconnected qubits; and an optical network interconnecting the first microwave-optical transducer and the second microwave-optical transducer. In still one embodiment, a method is provided that may include interconnecting a first microwave-optical transducer with a first qubit of a first superconducting quantum processing element that comprises a first plurality of interconnected qubits; interconnecting a second microwave-optical transducer with a first qubit of a second superconducting quantum processing element that comprises a second plurality of interconnected qubits; and interconnecting the first microwave-optical transducer and the second microwave-optical transducer with an optical network.

Example Embodiments

Quantum computers (QC) use quantum physics for performing computations and can provide advantages for certain tasks such as simulation or optimization of physical systems. Different technologies are under development to build quantum processor units (QPUs).

Current superconducting (SC) quantum technology used in forming SC quantum processing elements or 'chips' typically involves forming qubits using nonlinear circuits operating in microwave frequencies in which the qubits are coupled via electrical circuits, such as through a single capacitor, sometimes referred to generally as an adjustable coupler. Despite successes in small-scale implementations involving current SC quantum technology, such technology is often limited to architectures in which only a small number of qubits (e.g., approximately 50 qubits) are interconnected. Thus, current SC quantum technology can limit SC quantum processing element/chip architectures and scalability.

Given that some SC quantum architectures could potentially involve hundreds, thousands, or even millions of qubits for developing fault-tolerant quantum computers, the limitations of an all-SC chip implemented using current SC quantum technology will impede efforts to realize a large-scale quantum computer.

Referring to FIG. 1, FIG. 1 is a simplified diagram illustrating an example two-dimensional (2D) layout of a conventional superconducting (SC) quantum processing element or chip 100. As illustrated in FIG. 1, the conventional 2D layout of SC chips is based on nearest neighbor couplings between qubits. As shown in FIG. 1, qubits 102 are connected to nearest neighbors through an adjustable coupler 104, such as a capacitor. Other SC technologies, such as trapped ion can provide all-to-all connectivity. A qubit can be a two-level quantum system or a multi-level quantum system in which the lowest energy two levels are energetically separated from other levels that can, therefore, be treated as a two-level system.

However, not having remote couplings between qubits 102 as shown for the layout of FIG. 1 can result in time overhead during the execution of a quantum algorithm. For instance, as shown in FIG. 1, executing a single two qubit gate between qubits 102-1 and 102-7 involves 13 qubit steps (2×6+1) steps, including 12 SWAP gates between qubits to interconnect connecting qubits 102-1 and 102-7. Generally, a SWAP gate is a two-qubit operation that can be expressed in basis states.

Although current SC QPU chips include less than 100 qubits, scaling a single chip to billions of qubits would be a challenging engineering goal, at which the chip size would be about 1 meter×1 meter and would involve a large dilution refrigeration system in order to cool the chip to superconducting temperatures, typically in the range of 20 millikelvin (mK). Furthermore, large-scale SC systems can show chaotic behavior.

In order to address the limitations of existing approaches involving qubit-qubit connectivity and single-chip scalability, embodiments herein modular architectures for SC quantum processing elements or chips, as well as SC quantum systems, are provided herein through which qubits can be interconnected using optical/photonic interconnects. Various architectures involving cluster computing and modular single-chip architectural models are discussed for various embodiments herein. Utilizing architectures as provided herein can facilitate the realization of SC quantum computers having millions of qubits, which may provide unprecedented computing power for realizing powerful and scalable module SC quantum computers.

Figure 2A:
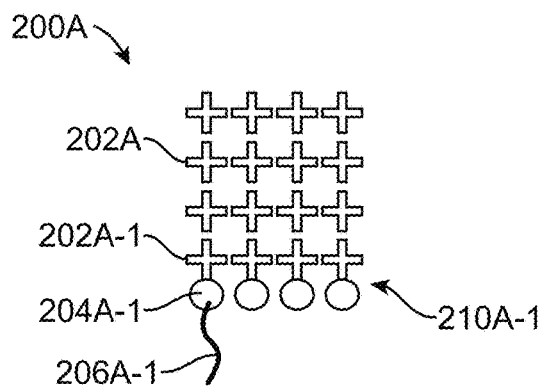
FIGS. 2A, 2B, and 2C are simplified diagrams illustrating example SC quantum processing elements including microwave-optical interconnections, according to various example embodiments.
Figure 2B:
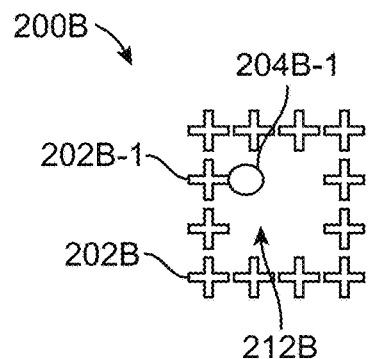
Figure 2C:
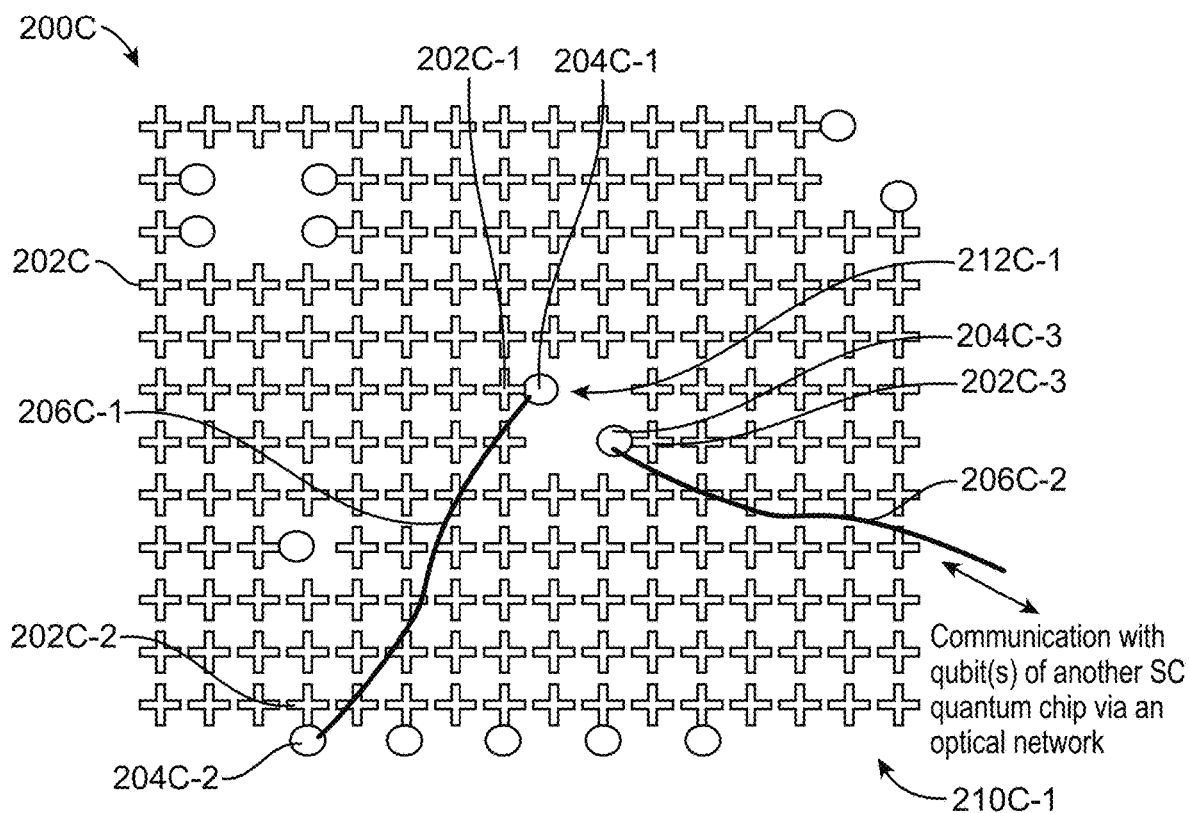

FIGS. 2A, 2B, and 2C illustrate various single chip architectural models for SC quantum processing elements or chips through which different cluster architectural models or systems may be realized in which multiple SC quantum processing elements or chips can be interconnected and communicate via an optical network. In contrast, FIG. 6, discussed in further detail below, illustrates an on-chip example architectural model in which qubits of an SC quantum chip can be interconnected using a network of photonic waveguide(s) and on-chip switch(es). As referred to herein, the terms 'processing element' and 'chip' can be used interchangeably in reference to different SC quantum architectures.

Referring to FIG. 2A, FIG. 2A illustrates an example architecture for an SC quantum chip 200A that includes a number of qubits 202A in which each qubit is shown as a 'cross' (+) symbol. The qubits 202A for SC quantum chip 200A are arranged/interconnected in a 2D grid or array. Note that interconnection elements, such as electrical couplers, etc. are not explicitly illustrated for various embodiments herein in order to illustrate other features of potential SC quantum architectures, however, it is to be understood that qubits discussed for embodiments herein can be implemented as any qubit interconnection elements as may be understood in the art, now known here and/or hereinafter developed. SC qubits that can be utilized for architectures described herein can include any variation of charge qubits, such as transmon, gmon, and/or xmon qubits.

For the embodiment of FIG. 2A, some of the qubits 202A can be used as communication qubits such that each of the communication qubits can be interconnected with a microwave-optical transducer that can further be coupled to an optical fiber. A typical microwave-optical transducer operates by having a mechanical oscillator (MO) intermediating between SC and optical domains. Generally, an SC qubit can be coupled to an MO via dipole-dipole coupling and the MO can further be coupled to an optical node in a similar manner.

Generally, a microwave-optical transducer, as discussed for embodiments herein, can be any device that provides for converting classical and/or quantum information between microwave and optical frequencies to facilitate communications between/among two or more qubits using any combination of optical fibers, optical networks (e.g., optical switches, repeaters, etc.), photonic waveguides, entangled photon-pair distribution units, and/or any other elements that may facilitate quantum and/or classical communications for SC quantum architectures described herein. Hardware microwave-optical transducers prototypes have been developed, such as those that involve utilizing bulk transducers, on-chip nano-mechanical interface transducers, and other chip-level type transducers. Microwave-optical transducers discussed for embodiments herein can be implemented as any microwave-optical transducers as may be understood in the art, now known here and/or hereinafter developed.

In some instances, fabrication challenges for manufacturing SC quantum chips can impose restrictions on the choice of qubits that are to be utilized for communication with other qubits via microwave-optical communications. For example, SC fabrication typically involves a heterogenous deposit of different materials. Further, in some instances SC fabrication may involve utilizing a three-dimensional (3D) chip if optical couplings are provided from a top surface/plane of an SC chip. As such, it is to be understood that microwave-transducers may be interconnected with qubits at any location of an SC quantum processing element or chip in accordance with embodiments herein.

In one embodiment, a microwave-optical transducer can be interconnected with interconnected with each of one or more qubit(s) disposed along one or more exterior edge(s) of an SC quantum chip. For example, as shown for the embodiment of FIG. 2A, a microwave-optical transducer 204A-1 (illustrated as a '●' symbol) can be interconnected with qubit 202A-1 that is disposed along an exterior edge 210A-1 of SC quantum chip 200A. Microwave-optical transducer 204A-1 is further coupled to an optical fiber 206A-1, which can facilitate optical communications with one or more qubits (also having interconnections facilitated via corresponding microwave-optical transducers) in accordance with embodiments herein.

Microwave-optical transducer interconnections may not be limited to an exterior of SC quantum chips. Another potential microwave-optical interconnection example is illustrated in FIG. 2B in which an example SC quantum chip 200B is shown with a plurality of qubits 202B organized/arranged/interconnected in a 2D array. As shown for the embodiment of 2B, in some instances, one or more holes(s), such as a hole 212B, can be cut or otherwise fabricated into a 2D array of interconnected qubits, such that a microwave-optical transducer can be interconnected for each of one or more qubits arranged about an interior/interior edge(s) of an SC quantum chip. For example, FIG. 2B illustrates that a microwave-optical transducer 204B-1 can be interconnected with a qubit 202B-1 within hole 212B.

Any combination of qubit to microwave-optical transducer interconnections can be envisioned for an SC quantum chip, which can facilitate communications among nonadjacent qubits of a particular SC quantum chip and/or communications with one or more qubits of one or more other SC quantum chip(s). For example, FIG. 2C illustrates an SC quantum chip 200C having a plurality of qubits 202C organized/interconnected in a 2D array.

As shown in FIG. 2C, a hole 212C-1 can be provided about an interior of SC quantum chip 200C in which one or more qubits can be interconnected with a corresponding microwave-optical transducer, such as an interior qubit 202C-1 interconnected with a microwave-optical transducer 204C-1. Further, one or more qubits along an exterior edge 210C-1 of SC quantum chip can also be interconnected with a corresponding microwave-optical transducer, such as an exterior qubit 202C-2 interconnected with a microwave-optical transducer 204C-2.

In some embodiments, qubit to microwave-optical transducer (also referred to herein as 'qubit/microwave-optical') interconnections provided for a particular SC quantum chip can facilitate communications between nonadjacent qubits of the particular SC quantum chip, which can provide advantages over current SC quantum chip implementations, such as those shown in FIG. 1 in which qubits are limited to communications only with nearest-neighbor adjacent qubits.

As illustrated for the example architecture involving SC quantum chip 200C of FIG. 2C, for example, exterior qubit 202C-2 interconnected with a microwave-optical transducer 204C-2 can communicate with a nonadjacent qubit for the 2D array of SC quantum chip 200C, such as interior qubit 202C-1 interconnected with microwave-optical transducer 204C-1 via an optical fiber 206C-1 coupled to both microwave-optical transducer 204C-2 and microwave-optical transducer 204C-1.

Any combination of interconnections/communications among nonadjacent qubits of a particular SC quantum chip can be envisioned, such as, for example, a first exterior qubit in communication with a nonadjacent second exterior qubit for an SC quantum chip, a first interior qubit in communication with a nonadjacent second interior qubit, and/or (as shown in FIG. 2C), an interior qubit in communication with an exterior qubit. Further, other potential qubit/microwave-optical transducer interconnections/variations are al so shown (but not labeled) for the embodiment of FIG. 2C in order to illustrate the potentially unlimited combinations/variations of qubit/microwave-optical transducer interconnections that may be envisioned for SC quantum architectures, in accordance with various embodiments herein.

The example architecture involving SC quantum chip 200C can also facilitate qubit communications with qubit(s) of one or more other SC quantum chip(s) (not shown in FIG. 2C) utilizing any combination of exterior/interior qubit/microwave optical interconnections. For example, an interior qubit 202C-3 can be interconnected with a microwave-optical transducer 204C-3, which can further be coupled to an optical fiber 206C-2 that can be interconnected with an optical network (not shown in FIG. 2C) that can facilitate optical interconnection with qubit(s) of one or more other SC quantum chip(s), as discussed in further detail below.

Figure 3:
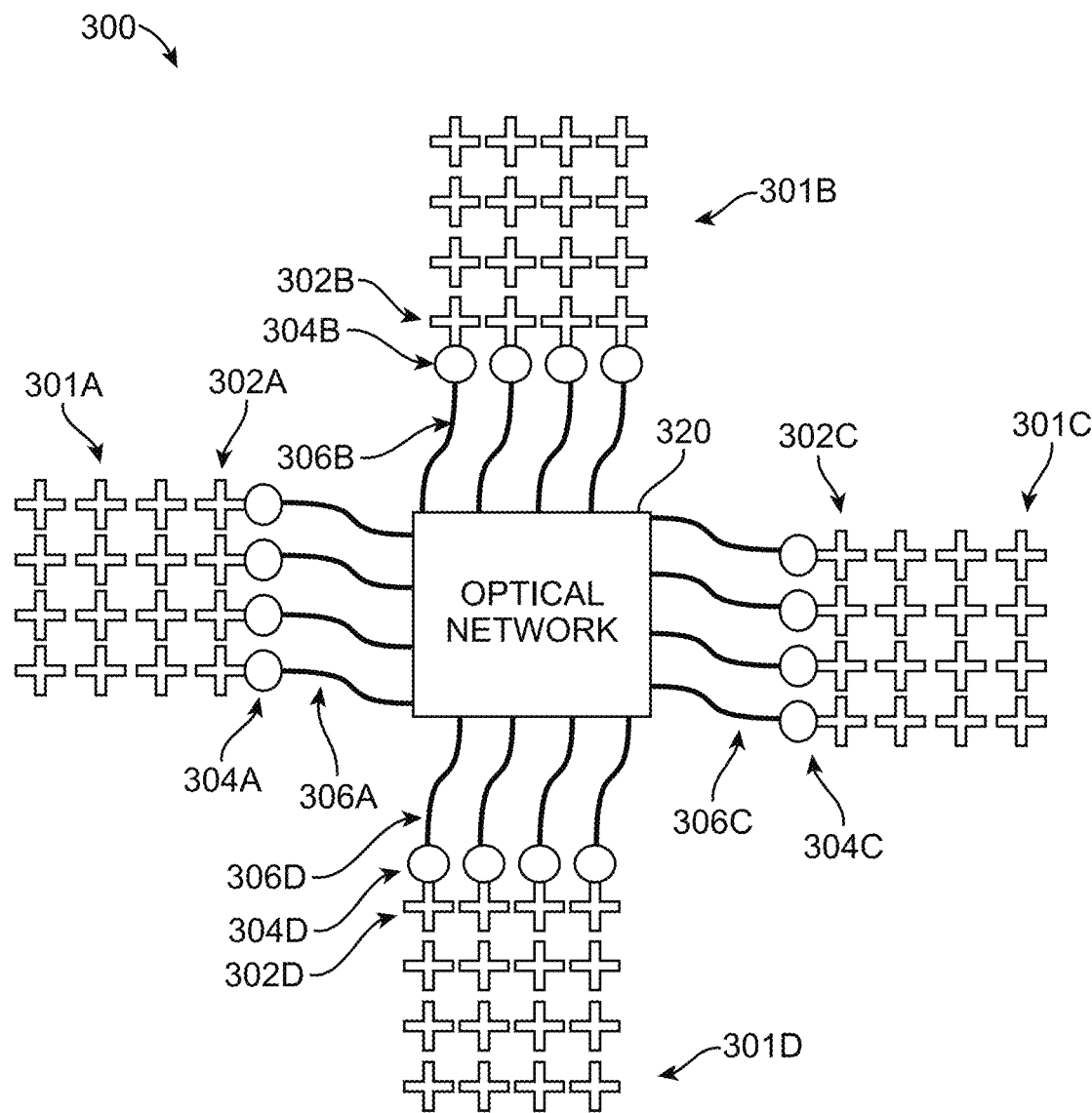
FIG. 3 is a simplified diagram illustrating an example SC quantum system including SC quantum processing elements interconnected via an optical network, according to an example embodiment.

For example, consider FIG. 3, which illustrates another example superconducting (SC) quantum architecture involving an SC quantum system 300 including a plurality of SC quantum processing elements or chips 301A, 301B, 301C, and 301D interconnected via an optical network 320, in accordance with embodiments herein. As illustrated in FIG. 3, each SC quantum chip 301A, 301B, 301C, and 301D can include a plurality of qubits organized/interconnected in corresponding 2D arrays.

The embodiment of FIG. 3 illustrates an example SC quantum architecture through which SC quantum chips 301A, 301B, 301C, and 301D, via corresponding qubits of each SC quantum chip can be interconnected and communicate via a configuration involving microwave-optical transducers, optical fibers, and optical network 320. For example, exterior qubits 302A of SC quantum chip 301A can each be interconnected with corresponding microwave-optical transducers 304A further coupled to optical fibers 306A that are interconnected with optical network 320. Further, exterior qubits 302B of SC quantum chip 301B can each be interconnected with corresponding microwave-optical transducers 304B further coupled to optical fibers 306B that are interconnected with optical network 320. Further, exterior qubits 302C of SC quantum chip 301C can each be interconnected with corresponding microwave-optical transducers 304C further coupled to optical fibers 306C that are interconnected with optical network 320, and exterior qubits 302D of SC quantum chip 301D can each be interconnected with corresponding microwave-optical transducers 304D further coupled to optical fibers 306D that are also interconnected with optical network 320.

Thus, any exterior qubits 302A, 302B, 302C, and/or 302D of any of SC quantum chips 301A, 301B, 301C, and/or 301D can communicate via optical network 320, which may be implemented as any combination of optical switches, routers, multiplexers, demultiplexers, quantum memories, a quantum Reconfigurable Optical Add Drop Multiplexer (ROADM), combinations thereof, and/or the like as may be understood in the art, now known here and/or hereinafter developed. In some instances, optical networks discussed herein may also be referred to has optical quantum networks.

The SC quantum architecture as illustrated in FIG. 3 can be extended to encompass interconnections among any combination of qubits of two or more SC quantum chips. For example, FIG. 4 illustrates another example SC quantum architecture involving an SC quantum system 400 including a plurality of SC quantum processing elements or chips 401 having qubits that can be interconnected via microwave-wave optical transducers 404, optical fibers 406, and a plurality of optical networks 420, in accordance with embodiments herein.

Figure 4:
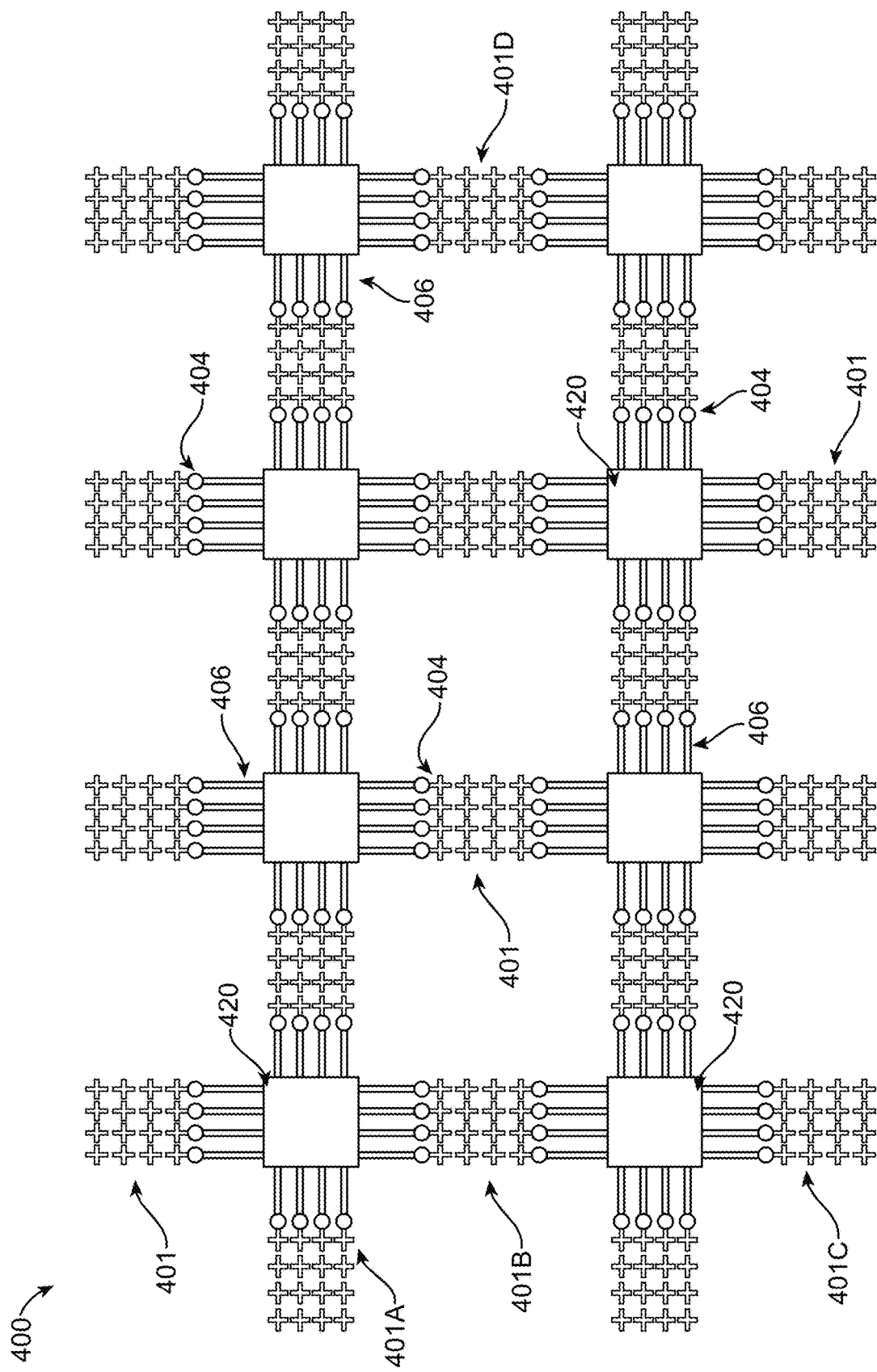
FIG. 4 is a simplified diagram illustrating another example SC quantum system including SC quantum processing elements interconnected in a 2D architecture, according to an example embodiment.

Although only exterior qubit interconnections are illustrated for the example architectures of FIGS. 3 and 4, it is to be understood that interconnections among any combination of interior and/or exterior qubits can be realized for SC quantum architectures, in accordance with embodiments herein (e.g., interior to interior and/or exterior to interior (and vice-versa)).

For the example architectures illustrated for the embodiments of FIGS. 3 and 4, SC quantum chips are generally interconnected in a 2D manner such that nearest neighbor chips are in communication with other nearest neighbor chips. For example, an SC quantum chip 401A may be in communication with a nearest neighbor SC quantum chip 401B, which may further be in communication with a nearest neighbor SC quantum chip 401C. However, none of SC quantum chips 401A, 401B, or 401C may be in communication with a non-nearest neighbor SC quantum chip 401D.

Figure 5:
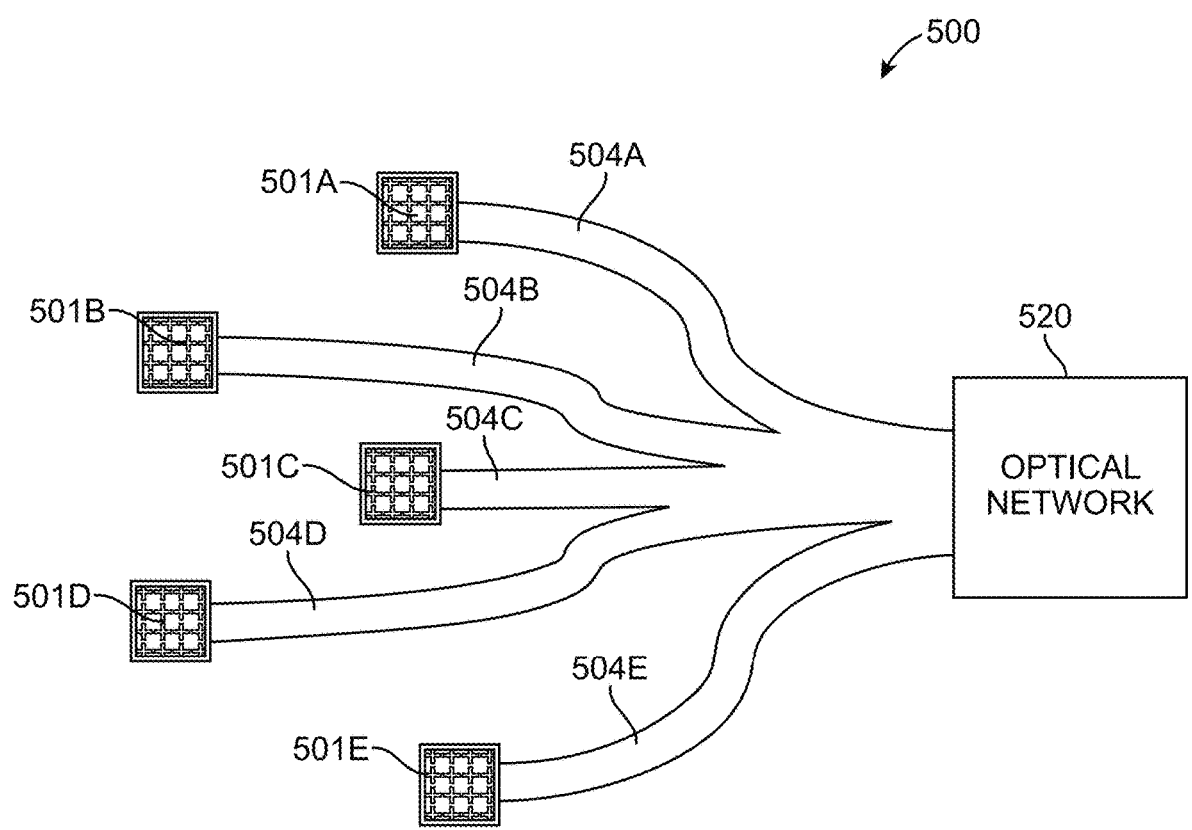
FIG. 5 is a simplified diagram illustrating another example SC quantum system including SC quantum processing elements interconnected in a three-dimensional (3D) architecture, according to an example embodiment.

However, the SC quantum architectures of FIGS. 3 and 4 can be further extended to three-dimensional 3D SC quantum architectures, such as illustrated in FIG. 5, which illustrates another example SC quantum architecture involving an SC quantum system 500 including a plurality of SC quantum processing elements or chips 501A, 501B, 501C, 501D, and 501E having qubits that can be interconnected via an optical network 520. As illustrated in FIG. 5, a corresponding array of optical fibers 504A, 504B, 504C, 504D, and 504E interconnected (via corresponding microwave-optical transducers, not shown in FIG. 5) to qubits of corresponding SC quantum chips 501A, 501B, 501C, 501D, and 501E can be utilized to facilitate any-to-any communications among interconnect qubits of any of SC quantum chips 501A, 501B, 501C, 501D, and/or 501E, in accordance with embodiments herein. Such an SC quantum architecture as illustrated in FIG. 5 has a higher level of connectivity than merely having a larger chip with nearest-neighbor connections. One potential advantage of higher connectivity is the possibility of executing longer algorithms, which can facilitate higher computational power for an SC quantum computer.

Figure 6:
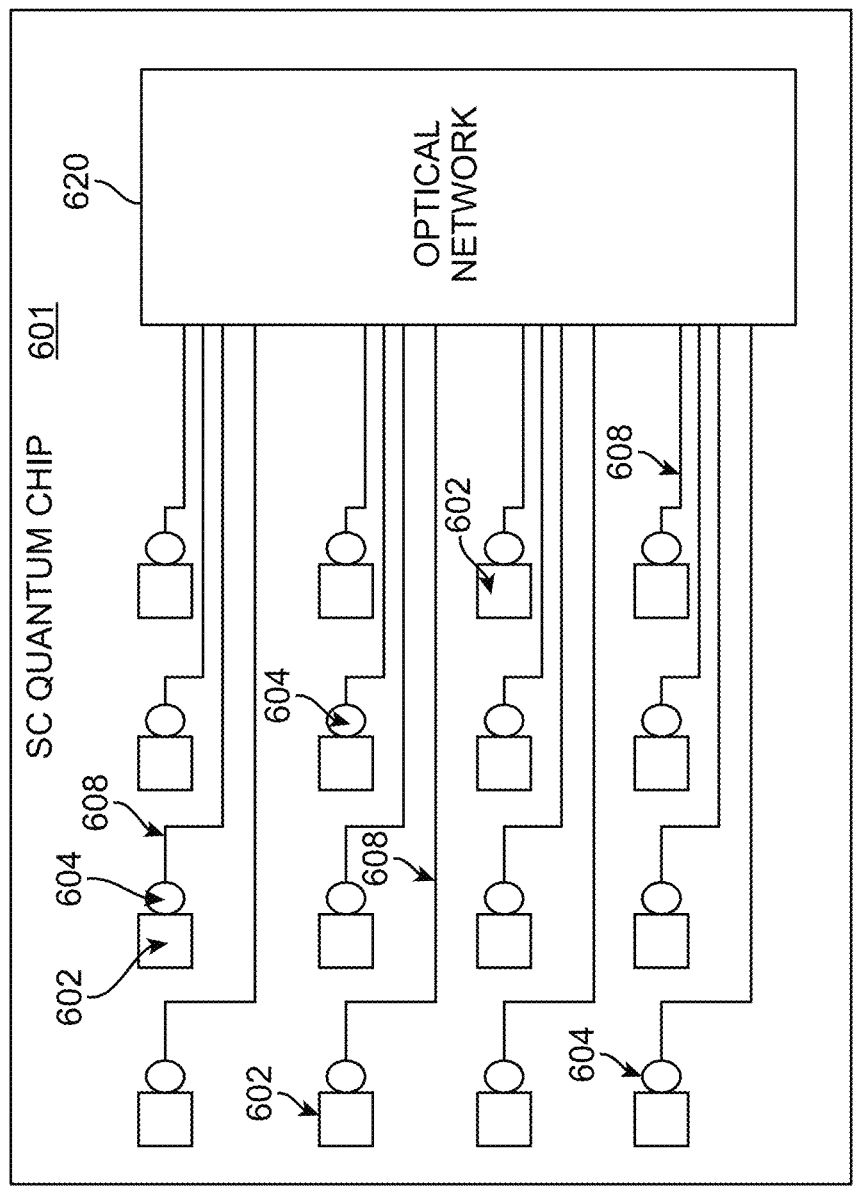
FIG. 6 is a simplified diagram illustrating another example SC quantum system including SC quantum processing elements interconnected via a photonic waveguide network, according to an example embodiment.

In the cluster architectural models as illustrated in FIGS. 2A, 2B, 2C, 3, 4, and 5, SC quantum chips or, more specifically, qubits of SC quantum chips, can be interconnected via optical fibers and/or one or more optical network (s). However, such a cluster model can be extended to facilitate on-chip architectural models in which on-chip connections among SC qubits can be connected through a network of photonic waveguides interconnected to one or more on-chip optical network(s). For example, FIG. 6 illustrates another example SC quantum architecture involving an SC quantum system in which a plurality of qubits 602 of an SC quantum chip 601 can each be interconnected to an optical network 620 via corresponding microwave-optical transducers 604 interconnected with each corresponding qubit 602 and further coupled to corresponding photonic waveguides 608 that are interconnected with optical network 620. Photonic waveguides 608 may also be referred to herein as a photonic waveguide network. Generally, photonic waveguides 608 may operate at telecommunication optical frequencies, such as 200 Terahertz (THz), 282 THz, etc.

Figure 7A:
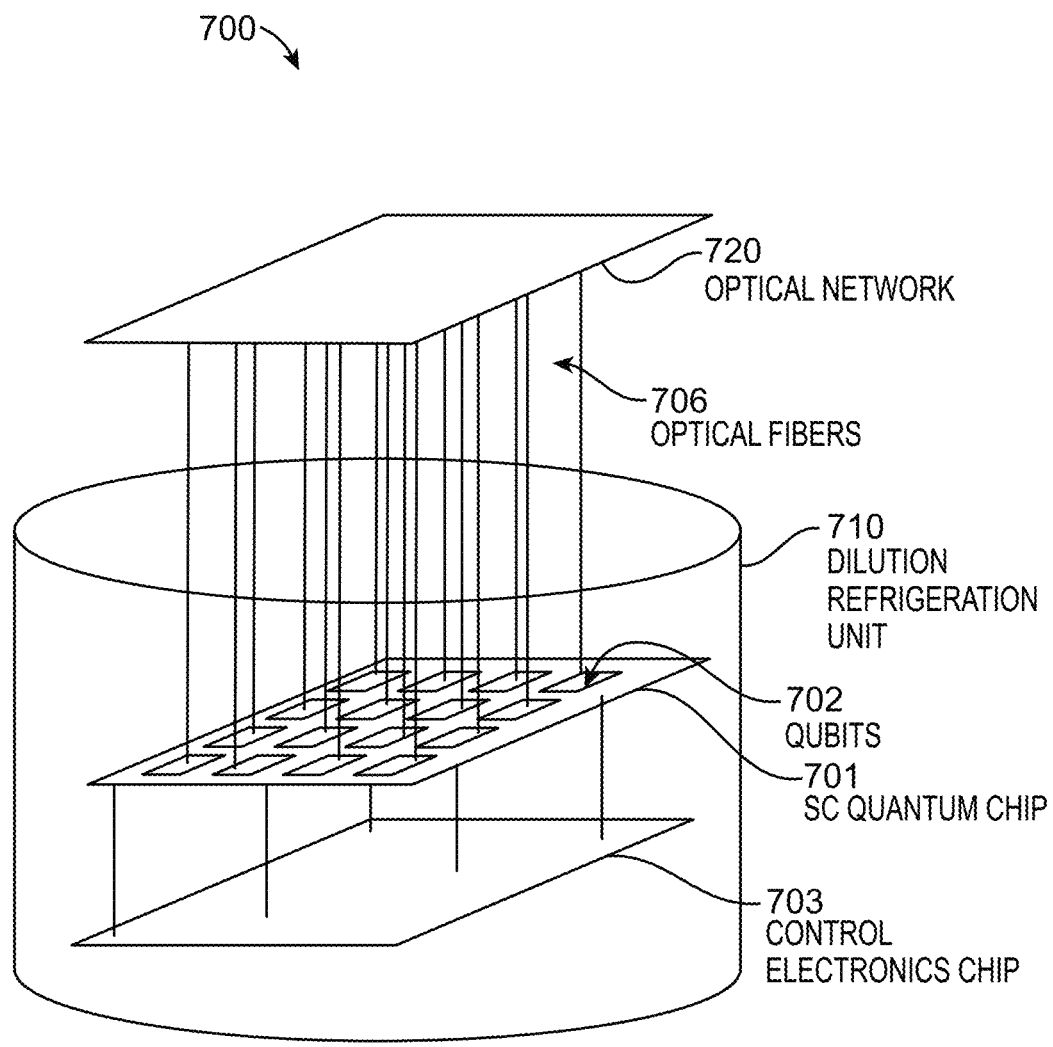
FIGS. 7A, 7B, 7C and 8 are simplified diagrams illustrating example details for example hybrid SC-optical systems through which SC quantum computers can be implemented, according to various example embodiments.

In some instances, embodiments herein may be implemented using a hybrid-SC optical system. FIGS. 7A, 7B, 7C and 8 are simplified diagrams illustrating example hybrid SC-optical systems through which SC quantum computers can be implemented, according to various example embodiments. For example, FIG. 7A illustrates an example hybrid SC-optical system 700, according to an example embodiment.

As illustrated in FIG. 7A, hybrid SC-optical system 700 may include an SC quantum chip 701 including a plurality of qubits 702 and also a control electronics chip 703 that is electrically coupled to the SC quantum chip. The SC quantum chip 701 and the control electronics chip 703 are cooled in a dilution cooling or refrigeration unit 710. Qubits 702 of the SC quantum chip 701 can be interconnected via microwave-optical transducers (not shown) and optical fibers 706 with an optical network 720. In at least one embodiment, optical network 720 may be representative of an entangled photon-pair distribution unit.

Figure 7B:
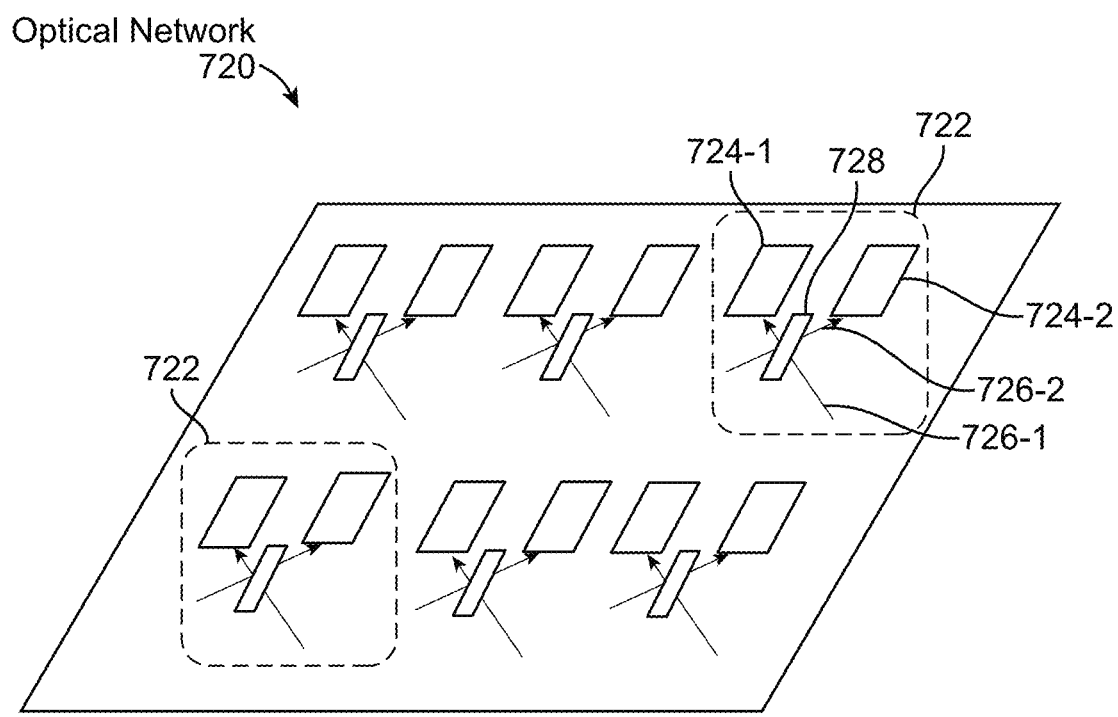
Figure 7C:
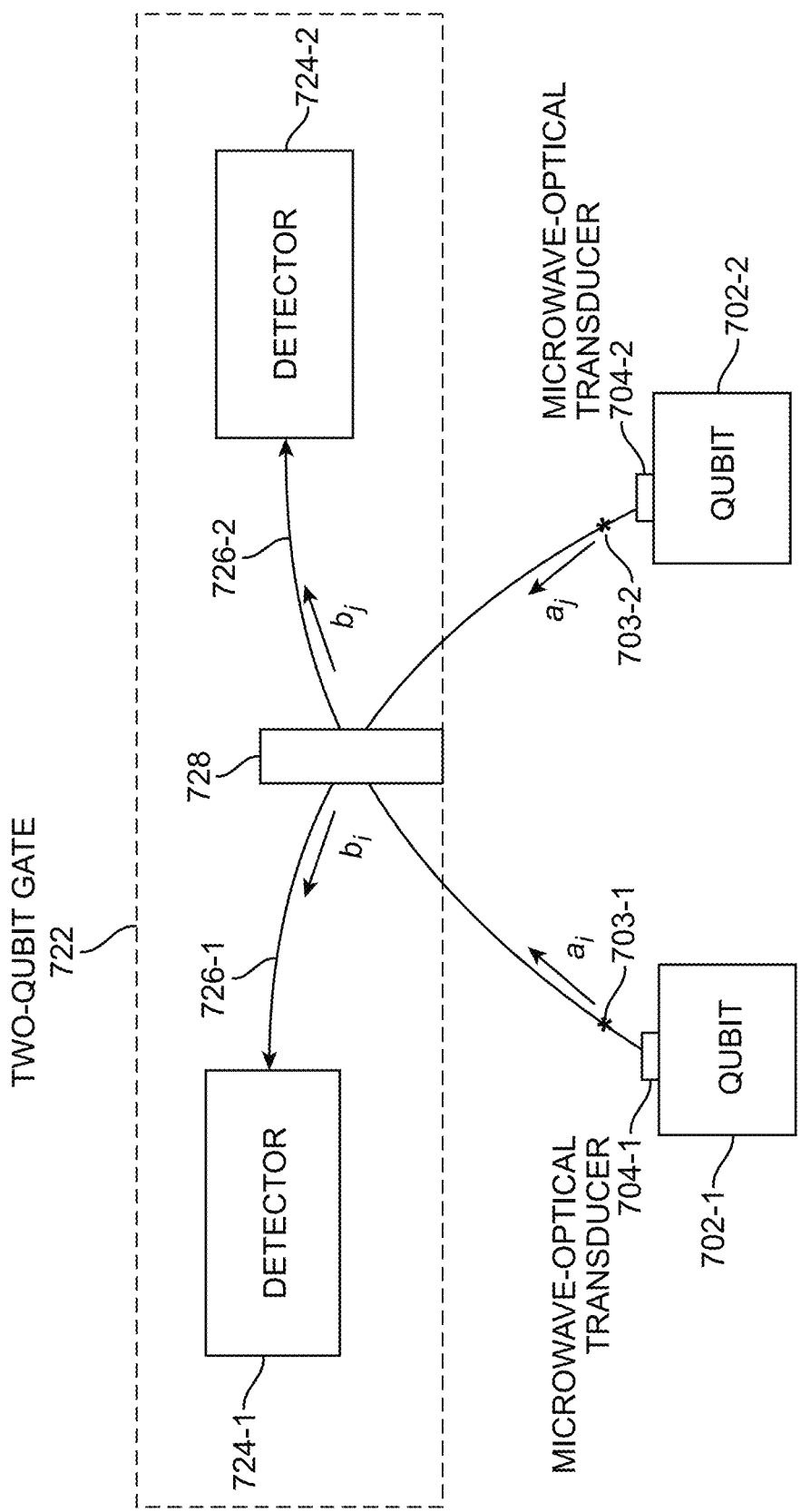

FIG. 7B illustrates example details of optical network 720 implemented as an entangled photon-pair distribution unit. As illustrated in FIG. 7B, the optical network 720 may include a number of probabilistic two-qubit gates 722 in which each two-qubit gate 722 includes a pair of detector units 724-1 and 724-2 (also sometimes referred to as 'readouts'), corresponding optical fibers or waveguides 726-1 and 726-2, and a beam splitter 728. FIG. 7C illustrates additional details associated with a corresponding two-qubit gate 722 in which each optical fiber/waveguide 726-1 can be interconnected with a microwave-optical transducer 704-2 that is interconnected with a qubit 702-2 and optical fiber/waveguide 726-2 can be interconnected with a microwave-optical transducer 704-1 that is interconnected with a qubit 702-1. In at least one embodiment, the optical network may be implemented as two chips, with a first chip including detector units for optical (two-qubit) gates and a second chip including the optical elements beam splitters and fibers or waveguides.

During operation of the two-qubit gate 722 as illustrated in FIG. 7C, a photon 703-1 (illustrated using the '*' symbol) is emitted from qubit 702-1/microwave-optical transducer 704-1 that is carried via optical fiber/waveguide 726-2 to detector unit 724-2 and a photon 703-2 is emitted from qubit 702-2/microwave-optical transducer 704-2 that is carried via optical fiber/waveguide 726-1 to detector unit 724-1. With a probability of $\sqrt{p_e(1-p_e)}$ only one of the detectors may 'click' (i.e., detect a photon) in which case qubits 702-1 and 702-2 are considered to be entangled. If only one 'click' is obtained, the process is accepted, effectuating a two-qubit gate.

The process can further be described as follows. After possible emission, the state of a given emitter (qubit) 'i' and photon can be expressed as: $|\psi\rangle = \sqrt{1-\rho_e}|\downarrow\rangle_i|vac\rangle + e^{ikx_i}\sqrt{\rho_e}|\uparrow\rangle_i \alpha_i^+|vac\rangle$. An emitter (qubit) 'j' can be expressed in a similar manner.

Consider various example details related to operation of the beam splitter 728 with reference to photonic variables '$a_i$' and '$b_i$' as shown in FIG. 7C that may be representative of corresponding photon states before and after traversing beam splitter 728. For example, the system of equations represented by '$\hat{O}$' as shown below in Equation 1 may represent the state of photons '$a_i$'/'$b_i$' and '$a_j$'/'$b_j$' before/after beam splitter 728 as follows:

$$\hat{O}: \begin{cases} a_i = (b_j + b_i)/\sqrt{2} \\ a_j = (b_i - b_j)/\sqrt{2} \end{cases} \quad \text{Eq. 1}$$

After the beam splitter 728, the state of the photons may be represented as shown below in Equation 2, as follows:

$$|\Psi_i\rangle \otimes |\Psi_j\rangle = (1-\rho_e)|\downarrow_i \downarrow_j\rangle|vac\rangle + \sqrt{\rho_e(1-\rho_e)}\left(e^{ikx_j}|\downarrow \uparrow\rangle a_j^+ + e^{ikx_i}|\downarrow \uparrow\rangle a_i^+\right)|vac\rangle + \rho_e e^{ik(x_i+x_j)}|\uparrow \uparrow\rangle a_i^+ a_j^+|vac\rangle \quad \text{Eq. 2}$$

During operation, the SC quantum chip 701 and control electronics chip 703 are maintained within the dilution cooling or refrigeration unit 710, which cools the chips down to 20 mK. While the SC quantum chip 701 and control electronics chip 703 reside inside the dilution refrigeration unit 710, the optical fibers 706 (interconnected to qubits 702 via microwave-optical transducers) can be guided outside the dilution refrigeration unit 710 such that the optical network 720 is operated external to the dilution refrigeration unit 710 and can be operated at room temperature.

The dilution refrigeration unit 710 may be implemented as any commonly known refrigeration unit used for SC quantum chips operating at approximately 20 mK. Temperature can affect performance of microwave-optical transducers discussed for embodiments herein. For example, it has been observed, in some instances that noise levels for transducers may increase linearly with temperature, up to 100 mK. Thus, it is to be understood that overall performance of architectures and systems described herein can depend on the engineering, manufacture, and operation of all components, including transducer fabrication, fiber coupling inside a dilution refrigeration unit, and also (outside a dilution refrigeration unit), the elements of one or more optical network(s) that may be utilized for interconnecting two or more SC quantum chips such that any source of loss and/or dephasing can reduce the performance of architectures/systems described herein.

Figure 8:
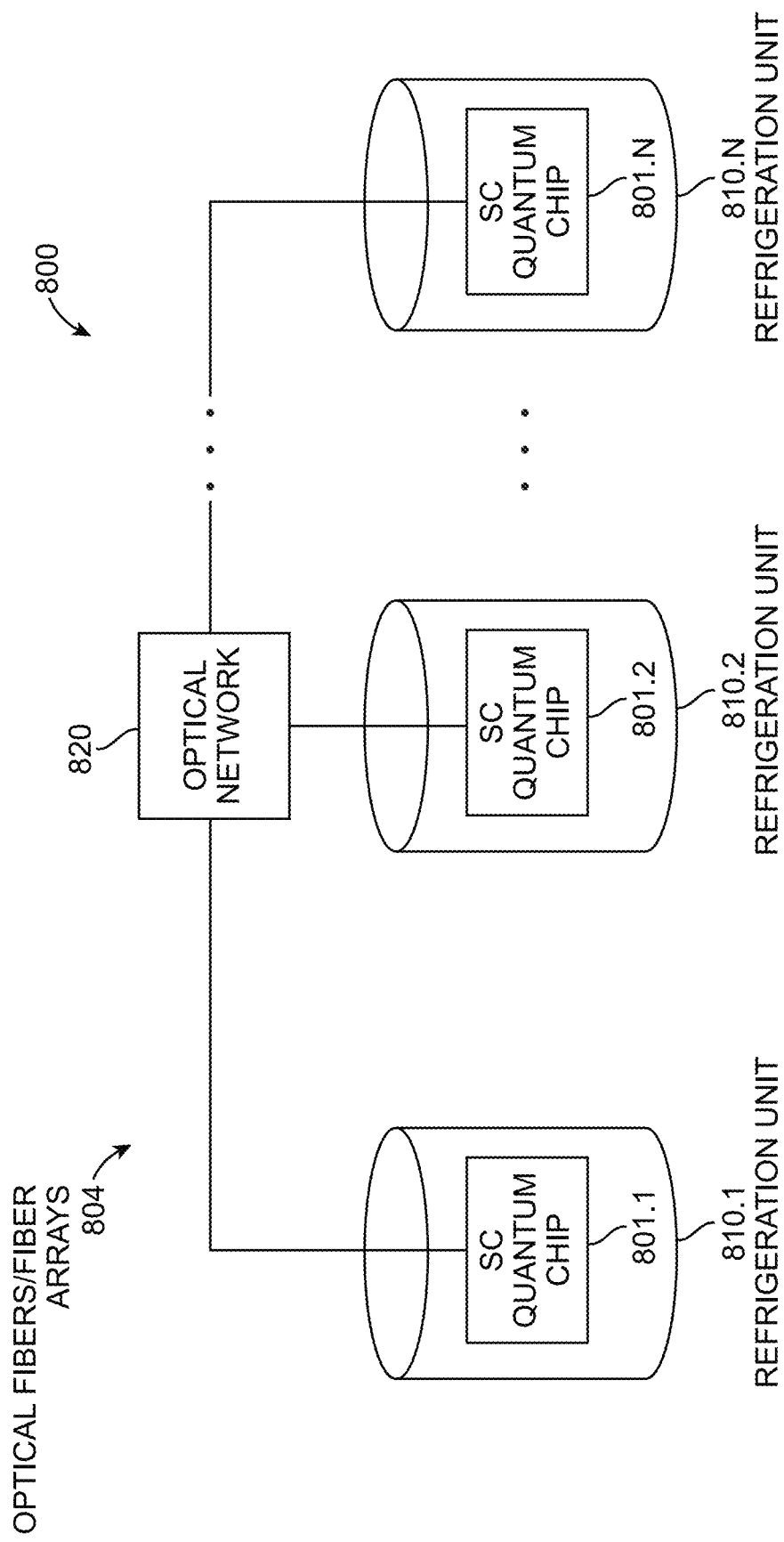

Features as illustrated for the system of FIG. 7A can be extended to facilitate interconnecting multiple SC quantum chips. For example, as illustrated in FIG. 8, a hybrid SC-optical system 800 can be provided in which multiple SC quantum chips (and corresponding electronics control chips, microwave-optical transducers, optical fibers/fiber arrays etc.) can be interconnected via one or more optical networks. As illustrated in FIG. 8, an 'N' number of SC quantum chips 801.1-801.N may be operated in an 'N' number of cooling or refrigeration units 810.1-810.N in which the SC quantum chips can be interconnected via corresponding optical fibers/fiber arrays 804 to one or more optical networks 820, operated outside of refrigeration units 810.1-810.N It is to be understood that in some embodiments for the systems illustrated in FIGS. 7A and 8 that multiple SC quantum chips can be operated in a same/common cooling/refrigeration unit.

Hybrid SC-optical architectures/systems described herein, such as those illustrated in FIGS. 7A and 8 may facilitate operation of an SC quantum computer through which quantum computing may be provided. Computing in such architectures/systems may be considered 'hybrid' in the sense that a circuit model can be operated/executed on each SC quantum chip of such architectures/systems, while gates (e.g., two-qubit gates 722) between separate chips can be provided via entanglement heralding techniques that are probabilistic in nature.

Figure 9:
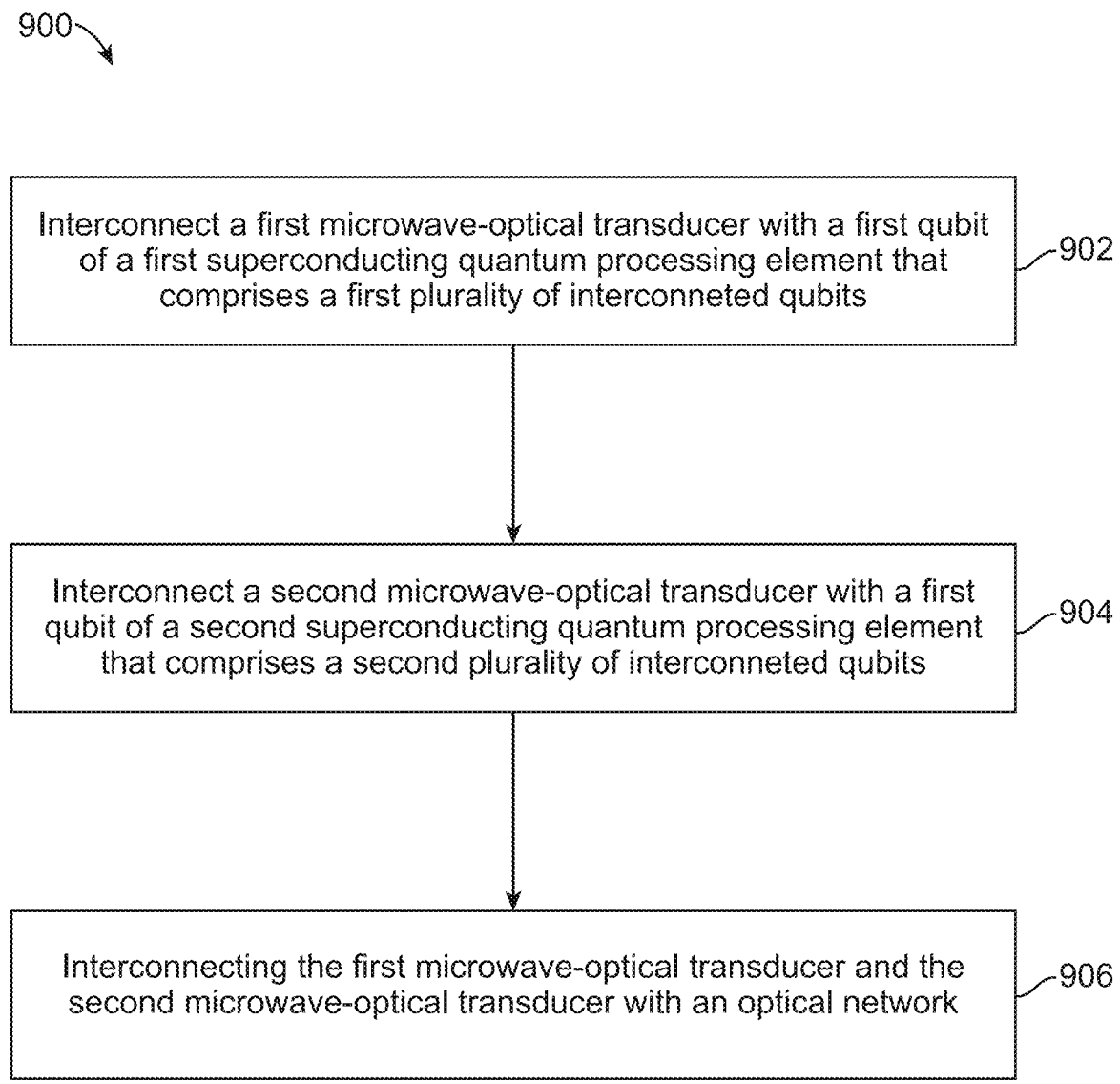
FIG. 9 is a flow chart depicting a method according to an example embodiment.

Referring to FIG. 9, FIG. 9 is a flow chart depicting a method according to an example embodiment. In at least one embodiment, method 900 illustrates example operations that may be performed to interconnect two or more SC quantum chips, according to an example embodiment.

At 902, the method may include interconnecting a first microwave-optical transducer with a first qubit of a first superconducting quantum processing element that comprises a first plurality of interconnected qubits. At 904, the method may include interconnecting a second microwave-optical transducer with a first qubit of a second superconducting quantum processing element that comprises a second plurality of interconnected qubits. At 906, the method may include interconnecting the first microwave-optical transducer and the second microwave-optical transducer with an optical network. In at least one embodiment, the first microwave-optical transducer is connected to the optical network via a first optical fiber and the second microwave-optical transducer is connected to the optical network via a second optical fiber.

Accordingly, in one form a superconducting (SC) processing element is provided that may include a plurality of interconnected qubits, wherein a first qubit of the plurality of interconnected qubits is interconnected with a first microwave-optical transducer. In one instance, the first qubit is an interior qubit of the SC processing element or an exterior qubit of the SC processing element. In one instance, a second qubit of the plurality of interconnected qubits is interconnected with a second microwave-optical transducer and the first microwave-optical transducer is interconnected with the second microwave-optical transducer via an optical fiber.

In one instance, the first qubit and the second qubit are nonadjacent. In one instance, the first qubit is an exterior qubit of the SC processing element, and the second qubit is an exterior qubit of the SC processing element. In one instance, the first qubit is an interior qubit of the SC processing element, and the second qubit is an exterior qubit of the SC processing element. In one instance, the first qubit is an interior qubit of the SC processing element, and the second qubit is an interior qubit of the SC processing element.

In one instance, the plurality of interconnected qubits are arranged in a two-dimensional array. In one instance, the SC processing element may further include a first photonic waveguide interconnected with the first microwave-optical transducer; and an optical network interconnected with the first photonic waveguide.

In one form, a system is provided that may include a first superconducting (SC) processing element comprising a first plurality of interconnected qubits, wherein a first microwave-optical transducer is interconnected with a first qubit of the first plurality of interconnected qubits; a second SC processing element comprising a second plurality of interconnected qubits, wherein a second microwave-optical transducer is interconnected with a first qubit of the second plurality of interconnected qubits; and an optical network interconnecting the first microwave-optical transducer and the second microwave-optical transducer.

In one instance, the first qubit of the first plurality of interconnected qubits is an exterior qubit of the first SC processing element and the first qubit of the second plurality of interconnected qubits is an exterior qubit of the second SC processing element. In one instance, the first qubit of the first plurality of interconnected qubits is an exterior qubit of the first SC processing element and the first qubit of the second plurality of interconnected qubits is an interior qubit of the second SC processing element. In one instance, the first qubit of the first plurality of interconnected qubits is an interior qubit of the first SC processing element and the first qubit of the second plurality of interconnected qubits is an interior qubit of the second SC processing element.

In one instance, each of a plurality of first qubits of the first plurality of qubits are interconnected with a corresponding first microwave-optical transducer, each of a plurality of first qubits of the second plurality of interconnected qubits are interconnected with a corresponding second microwave-optical transducer, and each first microwave-optical transducer and each second microwave-optical transducer is connected to the optical network.

In one instance, the first SC processing element and the second SC processing element are operated in a cooling unit and the optical network is operated external to the cooling unit. In one instance, the first SC processing element is operated in a first cooling unit, the second SC processing element is operated in a second cooling unit, and the optical network is operated external to the first cooling unit and the second cooling unit.

In one instance, the first microwave-optical transducer is connected to the optical network via a first optical fiber and the second microwave-optical transducer is connected to the optical network via a second optical fiber. In one instance, the first microwave-optical transducer is connected to the optical network via a first waveguide and the second microwave-optical transducer is connected to the optical network via a second waveguide. In one instance, the first plurality of interconnected qubits of the first SC processing element are arranged in a two-dimensional array. In one instance, the second plurality of interconnected qubits of the second SC processing element are arranged in a two-dimensional array.

In one form, a method is provided that may include interconnecting a first microwave-optical transducer with a first qubit of a first superconducting quantum processing element that comprises a first plurality of interconnected qubits; interconnecting a second microwave-optical transducer with a first qubit of a second superconducting quantum processing element that comprises a second plurality of interconnected qubits; and interconnecting the first microwave-optical transducer and the second microwave-optical transducer with an optical network. In one instance, the first microwave-optical transducer is connected to the optical network via a first optical fiber and the second microwave-optical transducer is connected to the optical network via a second optical fiber.

Note that in this Specification, references to various features (e.g., elements, structures, nodes, modules, components, engines, logic, steps, operations, functions, characteristics, etc.) included in 'one embodiment', 'example embodiment', 'an embodiment', 'another embodiment', 'certain embodiments', 'some embodiments', 'various embodiments', 'other embodiments', 'alternative embodiment', and the like are intended to mean that any such features are included in one or more embodiments of the present disclosure, but may or may not necessarily be combined in the same embodiments. Note also that a module, engine, client, controller, function, logic or the like as used herein in this Specification, can be inclusive of an executable file comprising instructions that can be understood and processed on a server, computer, processor, machine, compute node, combinations thereof, or the like and may further include library modules loaded during execution, object files, system files, hardware logic, software logic, or any other executable modules.

It is also noted that the operations and steps described with reference to the preceding figures illustrate only some of the possible scenarios that may be executed by one or more entities discussed herein. Some of these operations may be deleted or removed where appropriate, or these steps may be modified or changed considerably without departing from the scope of the presented concepts. In addition, the timing and sequence of these operations may be altered considerably and still achieve the results taught in this disclosure. The preceding operational flows have been offered for purposes of example and discussion. Substantial flexibility is provided by the embodiments in that any suitable arrangements, chronologies, configurations, and timing mechanisms may be provided without departing from the teachings of the discussed concepts.

As used herein, unless expressly stated to the contrary, use of the phrase 'at least one of', 'one or more of', 'and/or', variations thereof, or the like are open-ended expressions that are both conjunctive and disjunctive in operation for any and all possible combination of the associated listed items. For example, each of the expressions 'at least one of X, Y and Z', 'at least one of X, Y or Z', 'one or more of X, Y and Z', 'one or more of X, Y or Z' and 'X, Y and/or Z' can mean any of the following: 1) X, but not Y and not Z; 2) Y, but not X and not Z; 3) Z, but not X and not Y; 4) X and Y, but not Z; 5) X and Z, but not Y; 6) Y and Z, but not X; or 7) X, Y, and Z.

Additionally, unless expressly stated to the contrary, the terms 'first', 'second', 'third', etc., are intended to distinguish the particular nouns they modify (e.g., element, condition, node, module, activity, operation, etc.). Unless expressly stated to the contrary, the use of these terms is not intended to indicate any type of order, rank, importance, temporal sequence, or hierarchy of the modified noun. For example, 'first X' and 'second X' are intended to designate two 'X' elements that are not necessarily limited by any order, rank, importance, temporal sequence, or hierarchy of the two elements. Further as referred to herein, 'at least one of' and 'one or more of' can be represented using the '(s)' nomenclature (e.g., one or more element(s)).

Note that in certain example implementations, operations as set forth herein may be implemented by logic encoded in one or more tangible media that is capable of storing instructions and/or digital information and may be inclusive of non-transitory tangible media and/or non-transitory computer readable storage media (e.g., embedded logic provided in: an ASIC, digital signal processing (DSP) instructions, software [potentially inclusive of object code and source code], etc.) for execution by one or more processor(s) (e.g., hardware processor(s)), and/or other similar machine, etc. Generally, memory element(s) and/or storage can store data, software, code, instructions (e.g., processor instructions), logic, parameters, combinations thereof, and/or the like used for operations described herein. This includes memory element(s) and/or storage being able to store data, software, code, instructions (e.g., processor instructions), logic, parameters, combinations thereof, or the like that are executed to carry out operations in accordance with teachings of the present disclosure.

In some instances, software of the present embodiments may be available via a non-transitory computer useable medium (e.g., magnetic or optical mediums, magneto-optic mediums, CD-ROM, DVD, memory devices, etc.) of a stationary or portable program product apparatus, downloadable file(s), file wrapper(s), object(s), package(s), container(s), and/or the like. In some instances, non-transitory computer readable storage media may also be removable. For example, a removable hard drive may be used for memory/storage in some implementations. Other examples may include optical and magnetic disks, thumb drives, and smart cards that can be inserted and/or otherwise connected to a computing device for transfer onto another computer readable storage medium.

Each example embodiment disclosed herein has been included to present one or more different features. However, all disclosed example embodiments are designed to work together as part of a single larger system or method. This disclosure explicitly envisions compound embodiments that combine multiple previously discussed features in different example embodiments into a single system or method.

One or more advantages described herein are not meant to suggest that any one of the embodiments described herein necessarily provides all of the described advantages or that all the embodiments of the present disclosure necessarily provide any one of the described advantages. Numerous other changes, substitutions, variations, alterations, and/or modifications may be ascertained to one skilled in the art and it is intended that the present disclosure encompass all such changes, substitutions, variations, alterations, and/or modifications as falling within the scope of the appended claims.

What is claimed is:

1. A superconducting (SC) chip, comprising:
a plurality of interconnected qubits, wherein a first qubit of the plurality of interconnected qubits is interconnected with a first on-chip microwave-optical transducer configured for the SC chip and wherein a second qubit of the plurality of interconnected qubits is interconnected with a second on-chip microwave-optical transducer and the first on-chip microwave-optical transducer is interconnected with the second on-chip microwave-optical transducer via an optical fiber.

2. The SC chip of claim 1, wherein the first qubit is an interior qubit of the SC chip or an exterior qubit of the SC chip.

3. The SC chip of claim 1, wherein the first qubit and the second qubit are nonadjacent.

4. The SC chip of claim 1, wherein the first qubit is an exterior qubit of the SC chip and the second qubit is an exterior qubit of the SC chip.

5. The SC chip of claim 1, wherein the first qubit is an interior qubit of the SC chip and the second qubit is an exterior qubit of the SC chip.

6. The SC chip of claim 1, wherein the first qubit is an interior qubit of the SC chip and the second qubit is an interior qubit of the SC chip.

7. The SC chip of claim 1, the plurality of interconnected qubits are arranged in a two-dimensional array.

8. The SC chip of claim 1, wherein a third qubit of the plurality of interconnected qubits is interconnected with a third on-chip microwave-optical transducer configured for the SC chip, a first photonic waveguide is interconnected with the third on-chip microwave-optical transducer; and
an optical network is interconnected with the first photonic waveguide.

9. The SC chip of claim 8, wherein the optical network is an on-chip optical network.

10. A system comprising:
a first superconducting (SC) chip comprising a first plurality of interconnected qubits, wherein a first on-chip microwave-optical transducer is interconnected with a first qubit of the first plurality of interconnected qubits configured for the first SC chip;
a second SC chip comprising a second plurality of interconnected qubits, wherein a second on-chip microwave-optical transducer is interconnected with a first qubit of the second plurality of interconnected qubits configured for the second SC chip; and
an optical network interconnecting the first on-chip microwave-optical transducer and the second on-chip microwave-optical transducer.

11. The system of claim 10, wherein the first qubit of the first plurality of interconnected qubits is an exterior qubit of the first SC chip and the first qubit of the second plurality of interconnected qubits is an exterior qubit of the second SC chip.

12. The system of claim 10, wherein the first qubit of the first plurality of interconnected qubits is an exterior qubit of the first SC chip and the first qubit of the second plurality of interconnected qubits is an interior qubit of the second SC chip.

13. The system of claim 10, wherein the first qubit of the first plurality of interconnected qubits is an interior qubit of the first SC chip and the first qubit of the second plurality of interconnected qubits is an interior qubit of the second SC chip.

14. The system of claim 10, wherein each of multiple corresponding qubits of the first plurality of interconnected qubits are interconnected with each of multiple corresponding first on-chip microwave-optical transducers, each of multiple corresponding qubits of the second plurality of interconnected qubits are interconnected with each of multiple corresponding second on-chip microwave-optical transducers, and each of the multiple corresponding first on-chip microwave-optical transducers and each of the multiple corresponding second on-chip microwave-optical transducers are connected to the optical network.

15. The system of claim 10, wherein the first SC chip and the second SC chip are operated in a cooling unit and the optical network is operated external to the cooling unit.

16. The system of claim 10, wherein the first SC chip is operated in a first cooling unit, the second SC chip is operated in a second cooling unit, and the optical network is operated external to the first cooling unit and the second cooling unit.

17. The system of claim 10, wherein the first on-chip microwave-optical transducer is connected to the optical network via a first optical fiber and the second on-chip microwave-optical transducer is connected to the optical network via a second optical fiber.

18. The system of claim 10, wherein the first on-chip microwave-optical transducer is connected to the optical network via a first waveguide and the second on-chip microwave-optical transducer is connected to the optical network via a second waveguide.

19. The system of claim 10, wherein the first plurality of interconnected qubits of the first SC chip are arranged in a two-dimensional array.

20. The system of claim 19, wherein the second plurality of interconnected qubits of the second SC chip are arranged in a two-dimensional array.

21. A method, comprising:
interconnecting a first on-chip microwave-optical transducer with a first qubit of a first superconducting quantum chip that comprises a first plurality of interconnected qubits;
interconnecting a second on-chip microwave-optical transducer with a first qubit of a second superconducting quantum chip that comprises a second plurality of interconnected qubits; and
interconnecting the first on-chip microwave-optical transducer and the second on-chip microwave-optical transducer with an optical network.

22. The method of claim 21, wherein the first on-chip microwave-optical transducer is connected to the optical network via a first on-chip optical fiber and the second on-chip microwave-optical transducer is connected to the optical network via a second optical fiber.

* * * * *